United States Patent
Lin

(10) Patent No.: US 10,575,397 B1
(45) Date of Patent: Feb. 25, 2020

(54) CIRCUIT CARRIER STRUCTURE, MANUFACTURING METHOD THEREOF AND CHIP PACKAGE STRUCTURE

(71) Applicant: Unimicron Technology Corp., Taoyuan (TW)

(72) Inventor: Chien-Chen Lin, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/445,242

(22) Filed: Jun. 19, 2019

(30) Foreign Application Priority Data

Apr. 30, 2019 (TW) .............................. 108115003 A

(51) Int. Cl.
| | |
|---|---|
| *H05K 1/03* | (2006.01) |
| *H05K 3/46* | (2006.01) |
| *H05K 3/00* | (2006.01) |
| *H05K 1/02* | (2006.01) |
| *H01L 23/00* | (2006.01) |
| *H01L 23/498* | (2006.01) |

(52) U.S. Cl.
CPC ..... *H05K 1/0271* (2013.01); *H01L 23/49816* (2013.01); *H01L 24/04* (2013.01); *H01L 24/12* (2013.01); *H01L 24/19* (2013.01); *H01L 24/32* (2013.01); *H05K 3/4614* (2013.01); *H05K 3/4644* (2013.01); *H05K 3/4697* (2013.01); *H01L 2224/0401* (2013.01); *H01L 2224/04105* (2013.01); *H01L 2224/12105* (2013.01); *H01L 2224/32145* (2013.01); *H01L 2924/3511* (2013.01); *H05K 2203/061* (2013.01)

(58) Field of Classification Search
CPC .... H05K 1/038; H05K 1/0386; H05K 1/0393; H05K 1/0306; H05K 3/0067; H05K 3/4626

See application file for complete search history.

(56) References Cited

FOREIGN PATENT DOCUMENTS

| | | |
|---|---|---|
| CN | 106449554 | 2/2017 |
| TW | 201407224 | 2/2014 |
| TW | I556703 | 11/2016 |
| TW | I572267 | 2/2017 |

OTHER PUBLICATIONS

"Office Action of Taiwan Counterpart Application," dated Oct. 31, 2019, p. 1-p. 9.

*Primary Examiner* — Jeremy C Norris
(74) *Attorney, Agent, or Firm* — JCIPRNET

(57) ABSTRACT

A circuit carrier structure includes a glass substrate, an anti-warping layer, a conductive layer, a build-up circuit layer, and a conductive via. The glass substrate has a first surface, a second surface opposite to the first surface, and a through groove penetrating the glass substrate. The anti-warping layer is disposed on the first surface of the glass substrate and has at least one first opening and a second opening. The conductive layer is disposed in the first opening of the anti-warping layer. The build-up circuit layer is disposed on the second surface of the glass substrate. The conductive via penetrates the glass substrate. The conductive via is disposed corresponding to the first opening of the anti-warping layer, and the through groove is disposed corresponding to the second opening of the anti-warping layer, and the through groove exposes a portion of the build-up circuit layer.

10 Claims, 4 Drawing Sheets

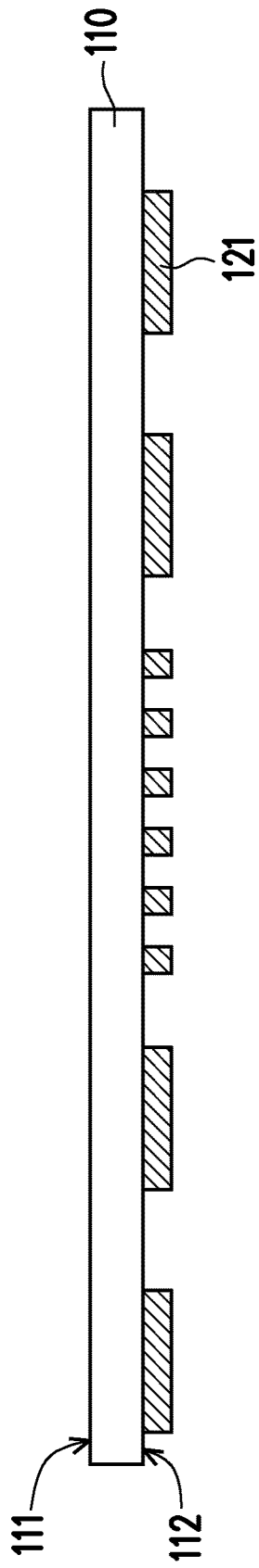
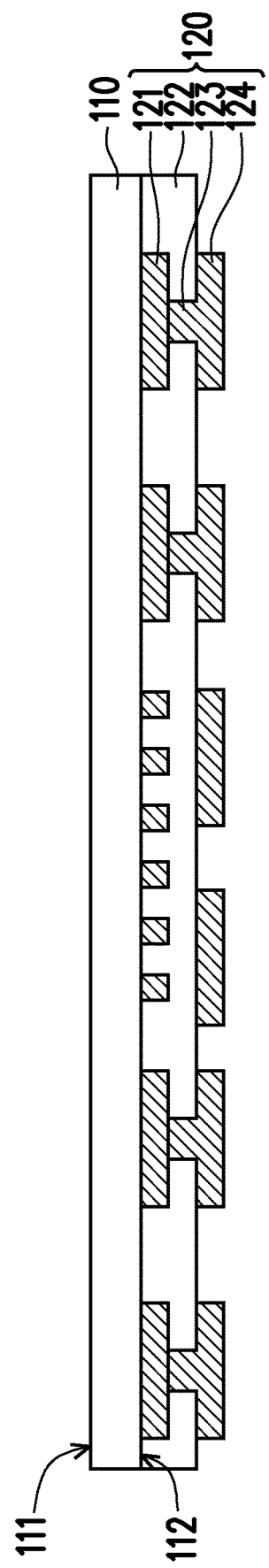
FIG. 1A
FIG. 1B

CIRCUIT CARRIER STRUCTURE, MANUFACTURING METHOD THEREOF AND CHIP PACKAGE STRUCTURE

CROSS-REFERENCE TO RELATED APPLICATION

This application claims the priority benefit of Taiwan application serial no. 108115003, filed on Apr. 30, 2019. The entirety of the above-mentioned patent application is hereby incorporated by reference herein and made a part of this specification.

BACKGROUND

Technical Field

The disclosure relates to a circuit carrier structure and a manufacturing method thereof, and more particularly to a circuit carrier structure having an anti-warping layer and a manufacturing method thereof.

Description of Related Art

Currently, in a circuit carrier structure of a circuit board, the circuit carrier structure generally includes a plurality of circuit layers and dielectric layers. However, when the build-up of layers is performed on one side of the circuit carrier, it is easy to cause warpage of the circuit carrier. In addition, when the material of the circuit carrier (such as BT resin) has poor flatness and insufficient rigidity, it is not suitable to manufacture fine circuits on the circuit carrier. Further, when grooves are formed in the circuit carrier by laser processing, the problem of circuit peeling is often caused by thermal effects.

SUMMARY

The disclosure provides a circuit carrier structure and a manufacturing method thereof, which can improve the problem that the circuit carrier has warpage, poor flatness and insufficient rigidity, and have better reliability.

The disclosure provides a chip package structure including the above-described circuit carrier structure, which has better package yield.

The circuit carrier structure of the disclosure includes a glass substrate, an anti-warping layer, a conductive layer, a build-up circuit layer, and a conductive via. The glass substrate has a first surface, a second surface opposite to the first surface, and a through groove penetrating the glass substrate. The anti-warping layer is disposed on the first surface of the glass substrate and has at least one first opening and a second opening. The conductive layer is disposed in the first opening of the anti-warping layer. The build-up circuit layer is disposed on the second surface of the glass substrate. The conductive via penetrates the glass substrate so that the conductive layer is electrically connected to the build-up circuit layer through the conductive via. The conductive via is disposed corresponding to the first opening of the anti-warping layer, and the through groove is disposed corresponding to the second opening of the anti-warping layer, and the through groove exposes a portion of the build-up circuit layer.

In an embodiment of the disclosure, the above-described build-up circuit layer at least includes a first circuit layer, at least one dielectric layer, at least one second circuit layer, and a plurality of via holes. The first circuit layer is disposed on the second surface of the glass substrate. The dielectric layer is disposed on the first circuit layer. The second circuit layer is disposed on the dielectric layer. The via holes penetrate the dielectric layer and electrically connect the first circuit layer and the second circuit layer. The glass substrate and the second circuit layer are respectively located at two opposite sides of the dielectric layer.

In an embodiment of the disclosure, the above-described through groove exposes a portion of a circuit of the first circuit layer of the build-up circuit layer.

In an embodiment of the disclosure, a material of the above-described anti-warping layer is a photoimageable dielectric (PID) material.

In an embodiment of the disclosure, the above-described through groove connects the first surface and the second surface of the glass substrate.

A chip package structure of the disclosure includes the above-described circuit carrier structure and a chip. The chip is disposed in the through groove of the circuit carrier structure. Solder balls are disposed on the chip.

A manufacturing method of a circuit carrier structure of the disclosure includes the following steps. A glass substrate is provided. The glass substrate has a first surface and a second surface opposite to the first surface. A build-up circuit layer is formed on the second surface of the glass substrate. An anti-warping layer is formed on the first surface of the glass substrate. The anti-warping layer has at least one first opening and a second opening. A conductive via is formed, and the conductive via penetrates the glass substrate. A conductive layer is formed in the first opening of the anti-warping layer so that the conductive layer is electrically connected to the build-up circuit layer through the conductive via. A through groove is formed, and the through groove penetrates the glass substrate and exposes a portion of the build-up circuit layer. The conductive via is disposed corresponding to the first opening of the anti-warping layer, and the through groove is disposed corresponding to the second opening of the anti-warping layer.

In an embodiment of the disclosure, the above-described step of forming the build-up circuit layer includes the following steps. A first circuit layer is formed on the second surface of the glass substrate. A dielectric layer is formed on the first circuit layer. A second circuit layer is formed on the dielectric layer. A plurality of via holes are formed. The via holes penetrate the dielectric layer and electrically connect the first circuit layer and the second circuit layer. The glass substrate and the second circuit layer are respectively located at two opposite sides of the dielectric layer.

Based on the above, the circuit carrier structure of the disclosure includes the glass substrate, the anti-warping layer, the conductive layer, the build-up circuit layer, and the conductive via. The anti-warping layer is disposed on the first surface of the glass substrate, and the conductive layer is disposed in the first opening of the anti-warping layer. The build-up circuit layer is disposed on the second surface of the glass substrate. The conductive via penetrates the glass substrate so that the conductive layer is electrically connected to the build-up circuit layer through the conductive via. The anti-warping layer can be used to counter the stress generated when the build-up circuit layer is manufactured; the glass substrate can provide better flatness and rigidity; the glass substrate can be etched to form the through groove. Therefore, the circuit carrier structure and the manufacturing method thereof of the disclosure can improve the problem that the circuit carrier has warpage, poor flatness and insufficient rigidity, and have better reliability.

In order to make the aforementioned features and advantages of the disclosure comprehensible, embodiments accompanied with drawings are described in detail below.

BRIEF DESCRIPTION OF THE DRAWINGS

FIGS. 1A to 1G are schematic cross-sectional views showing a manufacturing method of a circuit carrier structure according to an embodiment of the disclosure.

DESCRIPTION OF THE EMBODIMENTS

Figure 1C:
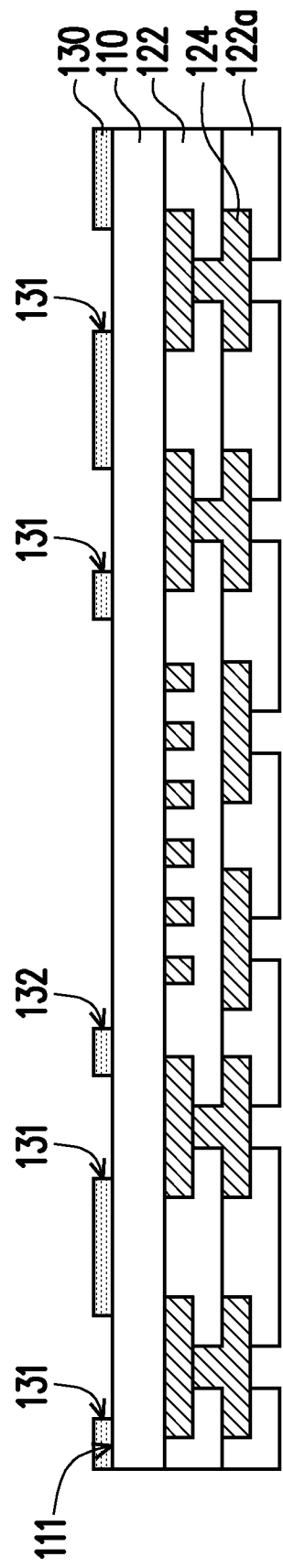

FIGS. 1A to 1G are schematic cross-sectional views showing a manufacturing method of a circuit carrier structure according to an embodiment of the disclosure.

With reference to FIG. 1A, in the embodiment, a glass substrate 110 is first provided, wherein the glass substrate 110 has a first surface 111 and a second surface 112 opposite to the first surface 111.

Next, with reference to FIGS. 1A and 1B simultaneously, a build-up circuit layer 120 is formed on the second surface 112 of the glass substrate 110. In detail, in the embodiment, a step of forming the build-up circuit layer 120 includes the following steps. First, a first circuit layer 121 is formed on the second surface 112 of the glass substrate 110. In some embodiments, the method of forming the first circuit layer 121 is, for example, first forming a seed layer on the second surface 112 of the glass substrate 110, and the seed layer, for example, includes a titanium layer and a copper layer on the titanium layer. Next, a patterned photoresist layer is formed on the seed layer to expose a portion of the seed layer. Next, a conductive material is formed on the exposed seed layer by, for example, electroplating. The conductive material may be a metal or a metal alloy, such as copper, titanium, tungsten, aluminum or the like, or a combination thereof. Next, the photoresist and a portion of the seed layer are removed to form the first circuit layer 121. In other embodiments, the first circuit layer 121 may directly contact the glass substrate 110.

Then, after the first circuit layer 121 is formed on the second surface 112 of the glass substrate 110, a dielectric layer 122 is pressed onto the first circuit layer 121. The dielectric layer 122 covers the first circuit layer 121 and the second surface 112 of the glass substrate 110, so that the first circuit layer 121 is buried in the dielectric layer 122. Next, a plurality of via holes 123 and a second circuit layer 124 are formed. Specifically, the via holes 123 are formed in the dielectric layer 122 so that the via holes 123 penetrate the dielectric layer 122. The second circuit layer 124 is formed on the dielectric layer 122 so that the glass substrate 110 and the second circuit layer 124 are respectively located at two opposite sides of the dielectric layer 122. The via holes 123 electrically connect the first circuit layer 121 and the second circuit layer 124.

In particular, since the flatness of the glass substrate 110 is good, the first circuit layer 121 and the second circuit layer 124 formed on the glass substrate 110 may be fine circuits. In addition, though the build-up circuit layer 120 of the embodiment at least includes one first circuit layer 121, one dielectric layer 122, one second circuit layer 124, and a plurality of via holes 123, the disclosure is not limited thereto. That is, in other embodiments, the build-up circuit layer may further include one or more dielectric layers (such as a dielectric layer 122a) and one or more second circuit layers (such as a second circuit layer 124a), as shown in FIG. 1E.

Then, with reference to FIG. 1C, an anti-warping layer 130 is formed on the first surface 111 of the glass substrate 110, and the dielectric layer 122a is pressed onto the second circuit layer 124. The anti-warping layer 130 has at least one first opening 131 (schematically shown as four in FIG. 1C) and a second opening 132. The first openings 131 and the second opening 132 respectively expose a portion of the glass substrate 110. In the embodiment, the material of the anti-warping layer 130 is, for example, a photoimageable dielectric (PID) material or other suitable high shrinkage materials, but it is not limited thereto. In some embodiments, the material of the anti-warping layer 130 does not include a conductive material. In other embodiments, the anti-warping layer 130 may directly contact the glass substrate 110. In addition, the dielectric layer 122a covers the dielectric layer 122 and exposes a portion of the second circuit layer 124.

In particular, since the anti-warping layer 130 is formed on the first surface 111 of the glass substrate 110, the anti-warping layer 130 can be used to counter the stress generated by the build-up circuit layer 120 on the second surface 112 of the glass substrate 110, whereby the problem of warpage of the circuit carrier structure 100 of the embodiment can be avoided. In addition, since the patterning of a conventional dielectric layer material requires laser processing, there is a problem that the glass is easily damaged. In contrast, in the embodiment, the material of the anti-warping layer 130 is a photoimageable dielectric material, which allows for the use of lithographic etching in the patterning of the anti-warping layer 130, whereby damage to the glass substrate 110 can be avoided.

Figure 1D:
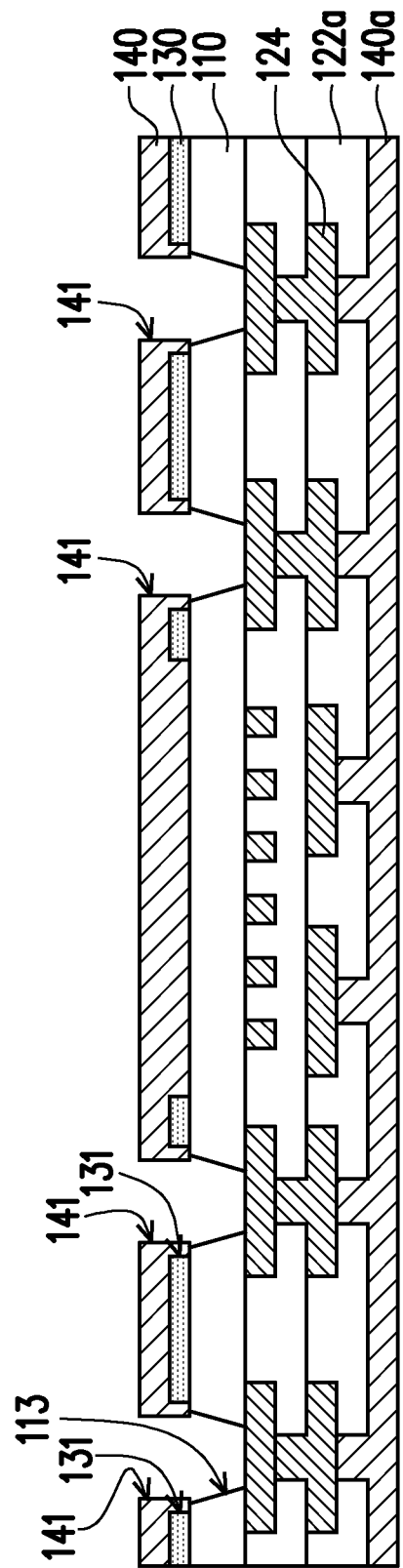
Figure 1E:
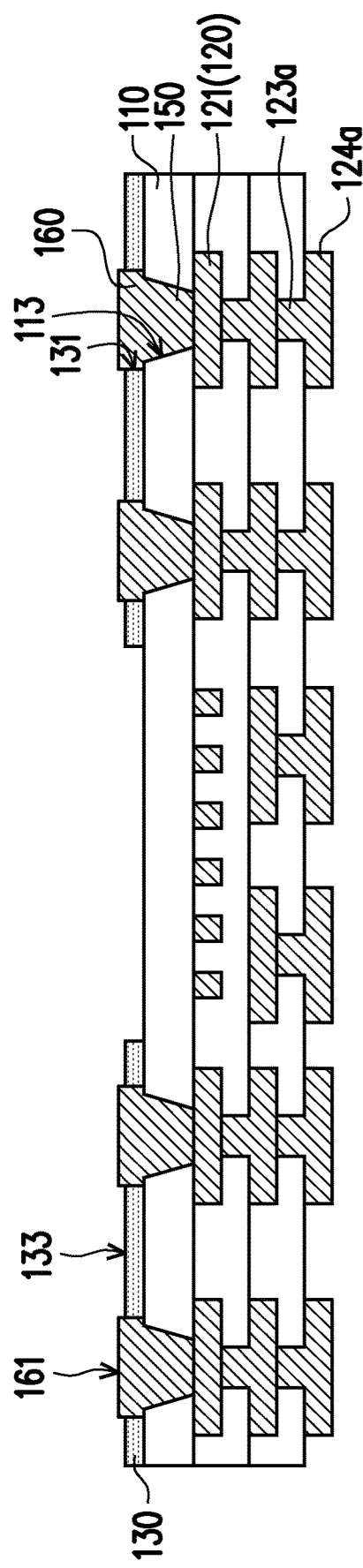

Then, with reference to FIG. 1D, a photoresist layer 140 is formed on the glass substrate 110, and a photoresist layer 140a is formed on the dielectric layer 122a. The photoresist layer 140 covers the anti-warping layer 130. The photoresist layer 140 has a plurality of openings 141 (schematically shown as four in FIG. 1D), and the openings 141 are disposed corresponding to the first openings 131 of the anti-warping layer 130. In addition, the photoresist layer 140a covers the dielectric layer 122a and the portion of the second circuit layer 124 exposed by the dielectric layer 122a. In the embodiment, the photoresist layers 140 and 140a are, for example, dry films, but they are not limited thereto.

With reference to FIG. 1D, a plurality of through holes 113 are formed in the glass substrate 110 so that the through holes 113 penetrate the glass substrate 110. The through holes 113 may be disposed corresponding to the openings 141 of the photoresist layer 140 and the first openings 131 of the anti-warping layer 130. The through holes 113 may connect the first surface 111 and the second surface 112 of the glass substrate 110 and expose a portion of the first circuit layer 121 of the build-up circuit layer 120. In the embodiment, the method of forming the through holes 113 is, for example, etching the glass substrate 110 with a glass etchant, but it is not limited thereto.

Next, with reference to FIG. 1E, the photoresist layers 140 and 140a are removed, and conductive vias 150, a conductive layer 160, via holes 123a, and the second circuit layer 124a are formed. In detail, a conductive material is filled in the through holes 113 of the glass substrate 110 and in the first openings 131 of the anti-warping layer 130 to form the conductive vias 150 and the conductive layer 160, respectively. The conductive vias 150 penetrate the glass substrate 110, and the conductive vias 150 are disposed corresponding to the first openings 131 of the anti-warping layer 130. The conductive layer 160 may be electrically connected to the first circuit layer 121 of the build-up circuit layer 120 through the conductive vias 150. Further, the conductive layer 160 has a top surface 161 facing away from the glass substrate 110, and the anti-warping layer 130 has an upper surface 133 facing away from the glass substrate 110. In the embodiment, the top surface 161 of the conductive layer 160 may be higher than the upper surface 133 of the anti-warping layer 130, but it is not limited thereto. In other embodiments, the top surface 161 of the conductive layer 160 may be lower than the upper surface 133 of the anti-warping layer 130.

Figure 1F:
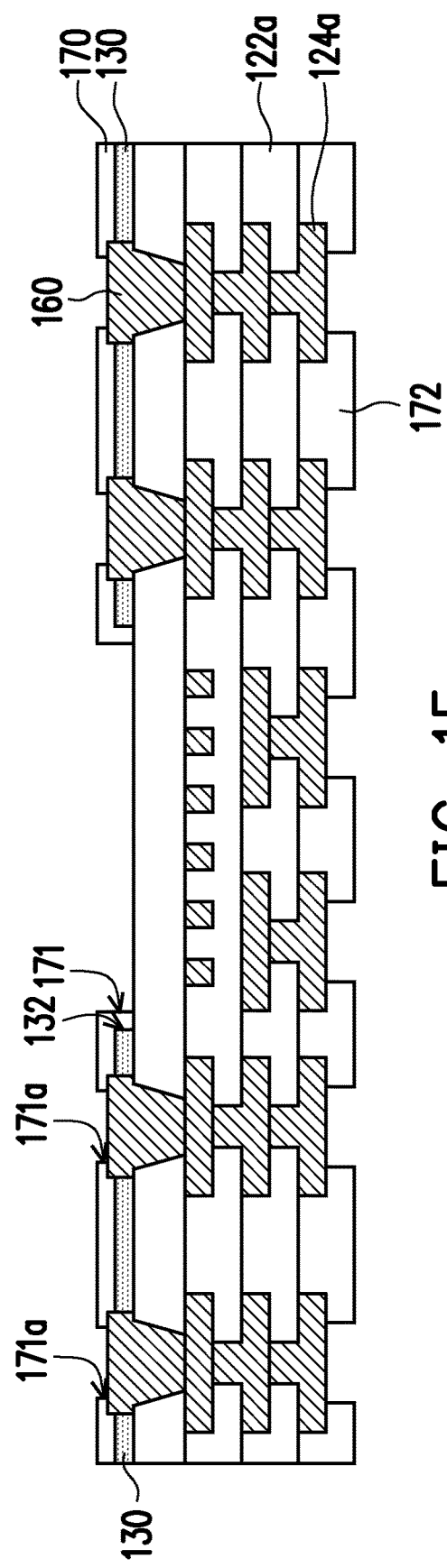

Then, with reference to FIG. 1F, a first solder mask layer 170 is formed on the anti-warping layer 130, and a second solder mask layer 172 is formed on the build-up circuit layer 120. In detail, the first solder mask layer 170 covers the anti-warping layer 130 so that the first solder mask layer 170 and the glass substrate 110 are respectively located at two opposite sides of the anti-warping layer 130. The first solder mask layer 170 has openings 171 and 171a, wherein the opening 171 exposes a portion of the glass substrate 110, and the openings 171a expose a portion of the conductive layer 160. The opening 171 of the first solder mask layer 170 is disposed corresponding to the second opening 132 of the anti-warping layer 130. In addition, the second solder mask layer 172 covers the dielectric layer 122a so that the second solder mask layer 172 and the glass substrate 110 are respectively located at two opposite sides of the build-up circuit layer 120. The second solder mask layer 172 exposes a portion of the second circuit layer 124a.

Figure 1G:
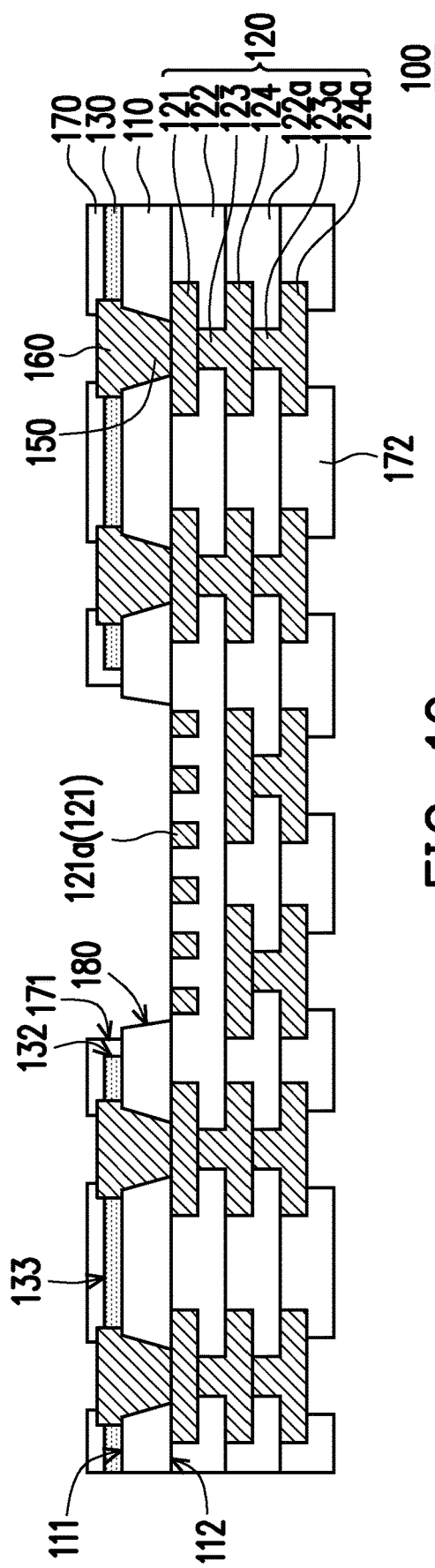

Then, with reference to FIG. 1G, a through groove 180 is formed in the glass substrate 110. In detail, the through groove 180 is formed in the glass substrate 110 corresponding to the opening 171 of the first solder mask layer 170 and the second opening 132 of the anti-warping layer 130. The through groove 180 penetrates the glass substrate 110 and connects the first surface 111 and the second surface 112 of the glass substrate 110. The through groove 180 exposes a portion of a circuit 121a of the first circuit layer 121 of the build-up circuit layer 120. In the embodiment, the method of forming the through groove 180 is, for example, etching the glass substrate 110 with a glass etchant, but it is not limited thereto. At this time, the manufacture of the circuit carrier structure 100 of the embodiment has been completed.

In the embodiment, since the glass substrate 110 can be etched to form the through groove 180, the problem of peeling of the first circuit layer 121 caused by the thermal effects of laser processing can be avoided. Therefore, in the circuit carrier structure 100 of the embodiment, wiring can be performed at the bottom of the through groove 180 (such as a portion of the circuit 121a of the first circuit layer 121) to increase the circuit utilization area.

Though the embodiment disposes the build-up circuit layer 120 on the second surface 112 of the glass substrate 110, the disclosure is not limited thereto. That is, in other embodiments not shown, a build-up circuit layer may also be disposed on the first surface 111 of the glass substrate 110 so that the build-up circuit layer is stacked on the upper surface 133 of the anti-warping layer 130.

In short, the circuit carrier structure 100 of the embodiment includes the glass substrate 110, the anti-warping layer 130, the conductive layer 160, the build-up circuit layer 120, and the conductive vias 150. The glass substrate 110 has the first surface 111, the second surface 112 opposite to the first surface 111, and the through groove 180 penetrating the glass substrate 110. The anti-warping layer 130 is disposed on the first surface 111 of the glass substrate 110 and has the at least one first opening 131 and the second opening 132. The conductive layer 160 is disposed in the first openings 131 of the anti-warping layer 130. The build-up circuit layer 120 is disposed on the second surface 112 of the glass substrate 110. The conductive vias 150 penetrate the glass substrate 110 so that the conductive layer 160 is electrically connected to the build-up circuit layer 120 through the conductive vias 150. The conductive vias 150 are disposed corresponding to the first openings 131 of the anti-warping layer 130, and the through groove 180 is disposed corresponding to the second opening 132 of the anti-warping layer 130, and the through groove 180 exposes a portion of the build-up circuit layer 120. Since the anti-warping layer 130 can be used to counter the stress generated when the build-up circuit layer 120 is manufactured, the problem of warpage of the circuit carrier structure 100 can be avoided. Since the glass substrate 110 can provide better flatness and rigidity, the fine circuits manufactured have better reliability. Since the glass substrate 110 can be etched to form the through groove 180, the problem of peeling of the first circuit layer 121 caused by the thermal effects of laser processing can be avoided, so that the circuit carrier structure 100 of the embodiment has better reliability.

It is to be noted that the following embodiment uses the reference numerals and a part of the contents of the above embodiment, and the same reference numerals are used to denote the same or similar elements, and the description of the same technical content is omitted. For the description of the omitted part, reference may be made to the above embodiment, and details are not described in the following embodiment.

Figure 2:
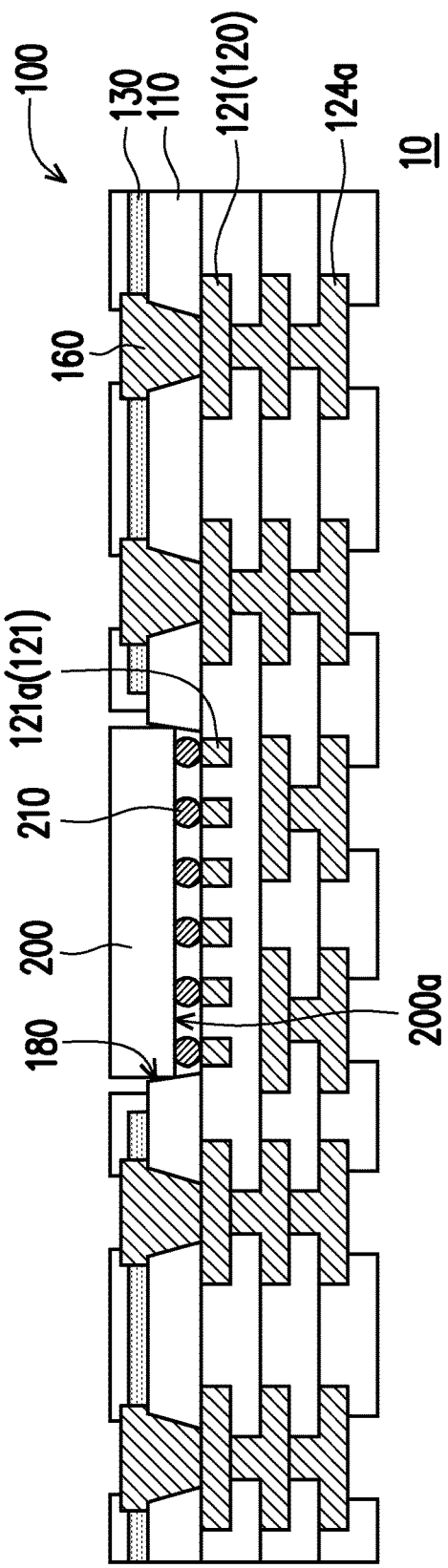
FIG. 2 is a schematic cross-sectional view showing a chip package structure according to an embodiment of the disclosure.

FIG. 2 is a schematic cross-sectional view showing a chip package structure according to an embodiment of the disclosure. With reference to FIG. 2, in a chip package structure 10 of the embodiment, a chip 200 is disposed in the circuit carrier structure 100 shown in FIG. 1G In detail, the chip package structure 10 of the embodiment includes the circuit carrier structure 100, the chip 200, and a plurality of solder balls 210. The plurality of solder balls 210 may be disposed on an active surface 200a of the chip 200 so that the chip 200 is disposed in the through groove 180 of the circuit carrier structure 100 through the solder balls 210. The chip 200 may also be electrically connected to a portion of the circuit 121a of the first circuit layer 121 of the build-up circuit layer 120 through the solder balls 210. In addition, though the chip 200 of the chip package structure 10 of the embodiment is disposed in the through groove 180 of the circuit carrier structure 100 through the solder balls 210, the disclosure does not limit the package method of the chip. In some embodiments, the chip may be disposed on the circuit carrier structure through bumps. In other embodiments, a glue layer (such as an underfill) may be further added between the chip and the circuit carrier structure so that the chip can be more closely attached to the circuit carrier structure.

In addition, the chip package structure 10 of the embodiment may also serve as an interposer or may be stacked with other package structures to form a package-on-package (POP) structure.

In summary of the above, the circuit carrier structure of the disclosure includes the glass substrate, the anti-warping layer, the conductive layer, the build-up circuit layer, and the conductive via. The anti-warping layer is disposed on the first surface of the glass substrate, and the conductive layer is disposed in the first opening of the anti-warping layer. The build-up circuit layer is disposed on the second surface of the glass substrate. The conductive via penetrates the glass substrate so that the conductive layer is electrically connected to the build-up circuit layer through the conductive via. The anti-warping layer can be used to counter the stress generated when the build-up circuit layer is manufactured; the glass substrate can provide better flatness and rigidity; the glass substrate can be etched to form the through groove. Therefore, the circuit carrier structure and the manufacturing method thereof of the disclosure can improve the problem that the circuit carrier has warpage, poor flatness and insufficient rigidity, and have better reliability. In addition, the disclosure provides a chip package structure including the above-described circuit carrier structure, which has better package yield.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A circuit carrier structure, comprising:
    a glass substrate having a first surface, a second surface opposite to the first surface, and a through groove penetrating the glass substrate;
    an anti-warping layer disposed on the first surface of the glass substrate and having at least one first opening and a second opening;
    a conductive layer disposed in the first opening of the anti-warping layer;
    a build-up circuit layer disposed on the second surface of the glass substrate; and
    a conductive via penetrating the glass substrate so that the conductive layer is electrically connected to the build-up circuit layer through the conductive via, wherein the conductive via is disposed corresponding to the first opening of the anti-warping layer, the through groove is disposed corresponding to the second opening of the anti-warping layer, and the through groove exposes a portion of the build-up circuit layer.

2. The circuit carrier structure according to claim 1, wherein the build-up circuit layer at least comprises:
    a first circuit layer disposed on the second surface of the glass substrate;
    at least one dielectric layer disposed on the first circuit layer;
    at least one second circuit layer disposed on the dielectric layer; and
    a plurality of via holes penetrating the dielectric layer and electrically connecting the first circuit layer and the second circuit layer, wherein the glass substrate and the second circuit layer are respectively located at two opposite sides of the dielectric layer.

3. The circuit carrier structure according to claim 2, wherein the through groove exposes a portion of a circuit of the first circuit layer of the build-up circuit layer.

4. The circuit carrier structure according to claim 1, wherein a material of the anti-warping layer is a photoimageable dielectric material.

5. The circuit carrier structure according to claim 1, wherein the through groove connects the first surface and the second surface of the glass substrate.

6. A chip package structure, comprising:
    the circuit carrier structure according to claim 1; and
    a chip disposed in the through groove of the circuit carrier structure and electrically connected to the circuit carrier structure.

7. A manufacturing method of a circuit carrier structure, comprising:
    providing a glass substrate which has a first surface and a second surface opposite to the first surface;
    forming a build-up circuit layer on the second surface of the glass substrate;
    forming an anti-warping layer on the first surface of the glass substrate, the anti-warping layer having at least one first opening and a second opening;
    forming a conductive via which penetrates the glass substrate;
    forming a conductive layer in the first opening of the anti-warping layer so that the conductive layer is electrically connected to the build-up circuit layer through the conductive via; and
    forming a through groove which penetrates the glass substrate and exposes a portion of the build-up circuit layer, wherein the conductive via is disposed corresponding to the first opening of the anti-warping layer, and the through groove is disposed corresponding to the second opening of the anti-warping layer.

8. The manufacturing method of the circuit carrier structure according to claim 7, wherein a step of forming the build-up circuit layer comprises:
    forming a first circuit layer on the second surface of the glass substrate;
    forming a dielectric layer on the first circuit layer;
    forming a second circuit layer on the dielectric layer; and
    forming a plurality of via holes which penetrate the dielectric layer and electrically connect the first circuit layer and the second circuit layer, wherein the glass substrate and the second circuit layer are respectively located at two opposite sides of the dielectric layer.

9. The manufacturing method of the circuit carrier structure according to claim 8, wherein the through groove exposes a portion of a circuit of the first circuit layer of the build-up circuit layer.

10. The manufacturing method of the circuit carrier structure according to claim 7, wherein a material of the anti-warping layer comprises a photoimageable dielectric material.

* * * * *